United States Patent
Yen et al.

(10) Patent No.: US 9,559,053 B2
(45) Date of Patent: Jan. 31, 2017

(54) COMPACT VERTICAL INDUCTORS EXTENDING IN VERTICAL PLANES

(75) Inventors: Hsiao-Tsung Yen, Tainan (TW);
Huan-Neng Chen, Shalu Township (TW); Yu-Ling Lin, Taipei (TW);
Chin-Wei Kuo, Zhubei (TW);
Mei-Show Chen, Hsin-Chu (TW);
Ho-Hsiang Chen, Hsin-Chu (TW);
Min-Chie Jeng, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/091,440

(22) Filed: Apr. 21, 2011

(65) Prior Publication Data
US 2012/0268229 A1    Oct. 25, 2012

(51) Int. Cl.
   H01F 5/00     (2006.01)
   H01F 27/28    (2006.01)
   H01L 23/522   (2006.01)
   H01F 17/00    (2006.01)

(52) U.S. Cl.
   CPC ....... H01L 23/5227 (2013.01); H01F 17/0013 (2013.01); *H01F 2017/002* (2013.01); *H01F 2017/004* (2013.01); *H01L 2924/0002* (2013.01)

(58) Field of Classification Search
   USPC ................................................ 336/200, 232
   See application file for complete search history.

(56) References Cited

U.S. PATENT DOCUMENTS

| 6,037,649 | A * | 3/2000 | Liou ............................. 257/531 |
| 6,291,872 | B1 * | 9/2001 | Wang et al. .................. 257/531 |
| 7,205,876 | B2 * | 4/2007 | Lee et al. ...................... 336/200 |
| 7,782,166 | B2 | 8/2010 | Loke et al. |
| 2003/0013264 | A1 | 1/2003 | Yeo et al. |
| 2005/0003562 | A1 * | 1/2005 | Bhatt .................. H01L 23/5227 438/3 |
| 2007/0268105 | A1 * | 11/2007 | Walls ............................ 336/200 |
| 2008/0204183 | A1 * | 8/2008 | Loza ................... H01F 17/0013 336/200 |
| 2009/0079530 | A1 | 3/2009 | Chandrasekhar et al. |
| 2009/0108978 | A1 * | 4/2009 | Loke et al. ................... 336/200 |

FOREIGN PATENT DOCUMENTS

| CN | 1921035 A | 2/2007 |
| JP | 07320936 A | * 12/1995 |
| JP | 2007-059915 | 8/2007 |
| KR | 20030002204 A | 1/2003 |

OTHER PUBLICATIONS

Lee, S-H, et al., "A Low-Voltage 2.4GHz VCO with 3D Helical Inductors," IEEE, APCCAS 2006, pp. 518-521.

* cited by examiner

*Primary Examiner* — Tsz Chan
(74) *Attorney, Agent, or Firm* — Slater Matsil, LLP

(57) ABSTRACT

A device includes a substrate, and a vertical inductor over the substrate. The vertical inductor includes a plurality of parts formed of metal, wherein each of the parts extends in one of a plurality of planes perpendicular to a major surface of the substrate. Metal lines interconnect neighboring ones of the plurality of parts of the vertical inductor.

18 Claims, 8 Drawing Sheets

COMPACT VERTICAL INDUCTORS EXTENDING IN VERTICAL PLANES

BACKGROUND

Inductors are essential devices in many integrated circuits, such as radio-frequency (RF) circuits. It is often required that the inductors have high inductance values. This requirement, however, is difficult to achieve on integrated circuits because high inductance needs to be achieved with the cost of high chip area usage.

To improve the inductance of inductors, three-dimensional inductors were developed, wherein an inductor may be formed in a plurality of metal layers to form a helical shape, and the portions of the inductors in different metal layers are interconnected. The further improvement of the inductors, however, is still limited, for example, due to the increasingly smaller distances between metal layers and the respective semiconductor substrate, the requirement for forming dummy patterns, and the undesirable Eddy currents in the semiconductor substrate.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A vertical inductor is provided in accordance with an embodiment. The variations of the embodiment are then discussed. Throughout the various views and illustrative embodiments, like reference numbers are used to designate like elements.

Figure 1:
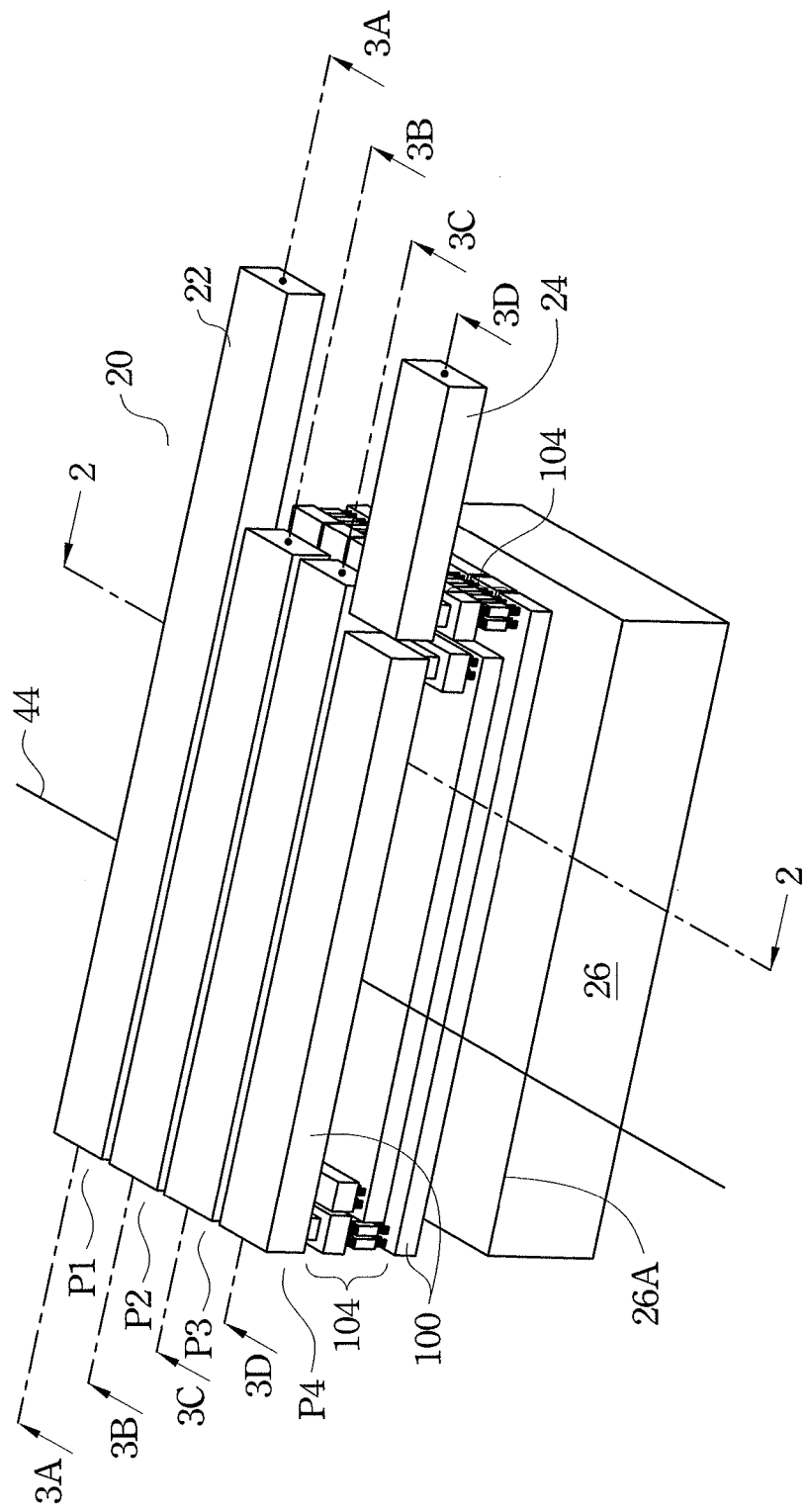
FIG. 1 illustrates a perspective view of a vertical helical inductor in accordance with an embodiment.

FIG. 1 illustrates a perspective view of inductor 20 in accordance with an embodiment. Inductor 20 includes ports 22 and 24. A current (not shown) injected into port 22 thus may flow to port 24, and vice versa. Inductor 20 is formed over substrate 26, which may be a semiconductor substrate such as a silicon substrate, a dielectric substrate, or the like. In the illustrated exemplary embodiment, inductor 20 includes parts P1 through P4, which are interconnected through metal lines. In alternative embodiments, inductor 20 may include more or fewer parts.

Figure 2:
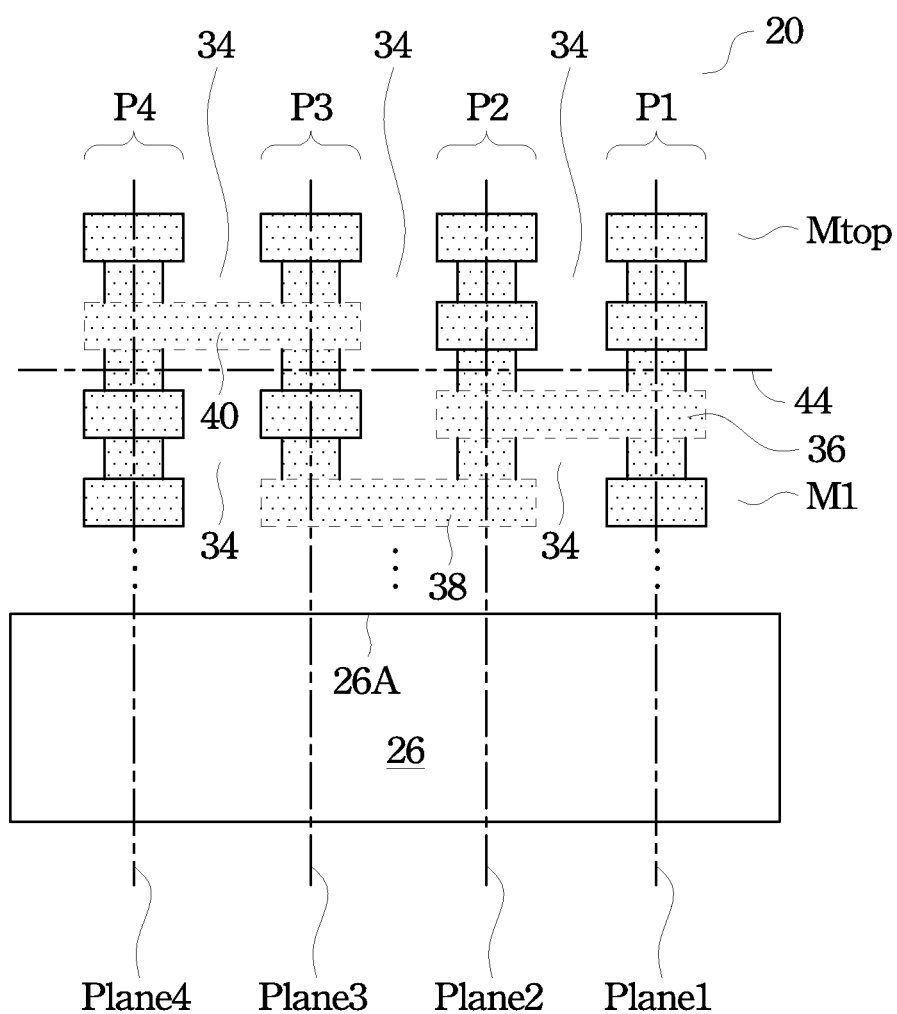
FIGS. 2 through 3D are cross-sectional views of the vertical helical inductor in FIG. 1.

FIG. 2 illustrates a cross-sectional view of the structure shown in FIG. 1, wherein the cross-sectional view is obtained from the plane crossing line 2-2 in FIG. 1. Inductor 20 includes portions formed in a plurality of metal layers, which is shown as M1 (the bottom metal layer in the respective die/wafer) through Mtop (the top metal layer in the respective die/wafer) in the illustrated exemplary embodiment. It is noted, however, that inductor 20 may or may not include portions in bottom metal layer M1 and/or top metal layer Mtop.

As shown in FIG. 2, inductor parts P1 through P4 are separated from each other by dielectric regions 34, wherein each of dielectric regions 34 includes portions in a plurality of dielectric layers, in which metal layers M1 through Mtop are formed. Part P1 is connected to part P2 through metal line 36. Part P2 is connected to part P3 through metal line 38. Part P3 is connected to part P4 through metal line 40. In an embodiment, metal lines 36, 38, and 40 are in different metal layers, although they can be formed in same metal layers. Metal lines 36, 38, and 40 are illustrated using dashed line since they may be in planes different from the illustrated plane. The lengthwise directions of metal lines 36, 38, and 40 are parallel to major surface 26A of substrate 26.

Figure 3A:
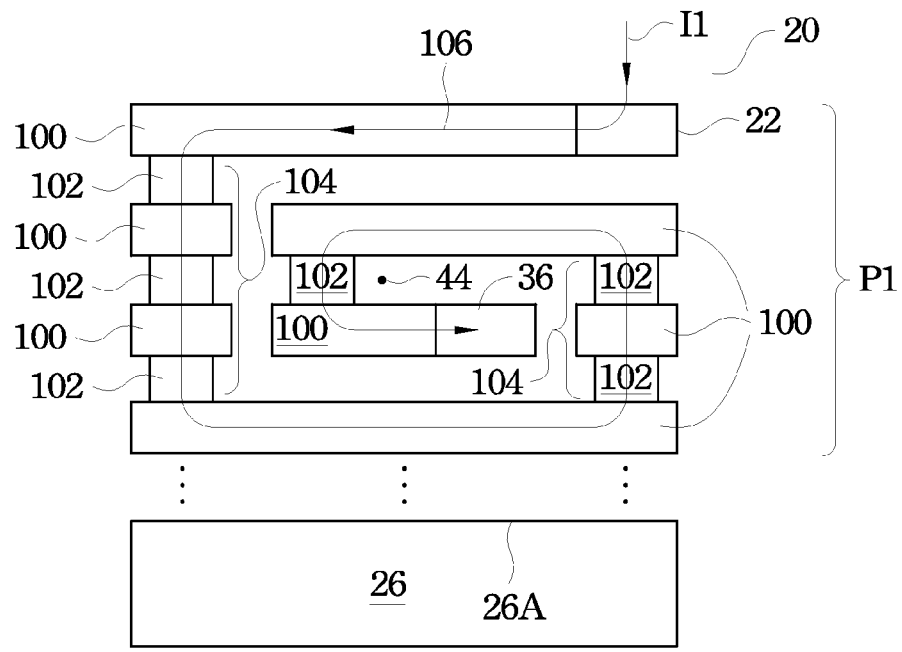

FIGS. 3A through 3D are cross-sectional views of the structure shown in FIG. 1, wherein the cross-sectional views are obtained in the vertical planes crossing lines 3A-3A, 3B-3B, 3C-3C, and 3D-3D, respectively, in FIG. 1. Referring to FIG. 3A, assuming current I1 flows from port 22 to port 24, then starting from port 22, metal lines/pads 100 and vias 102 form a spiral metal feature spinning from outer side to inner side (please refer to arrow 106), until metal line 36 is reached.

Figure 3B:
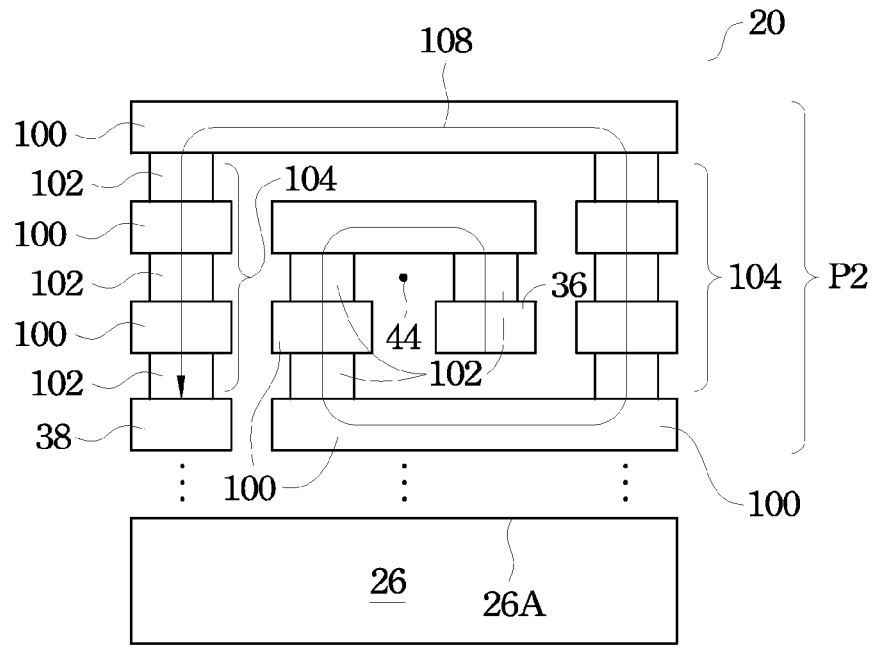
Figure 3C:
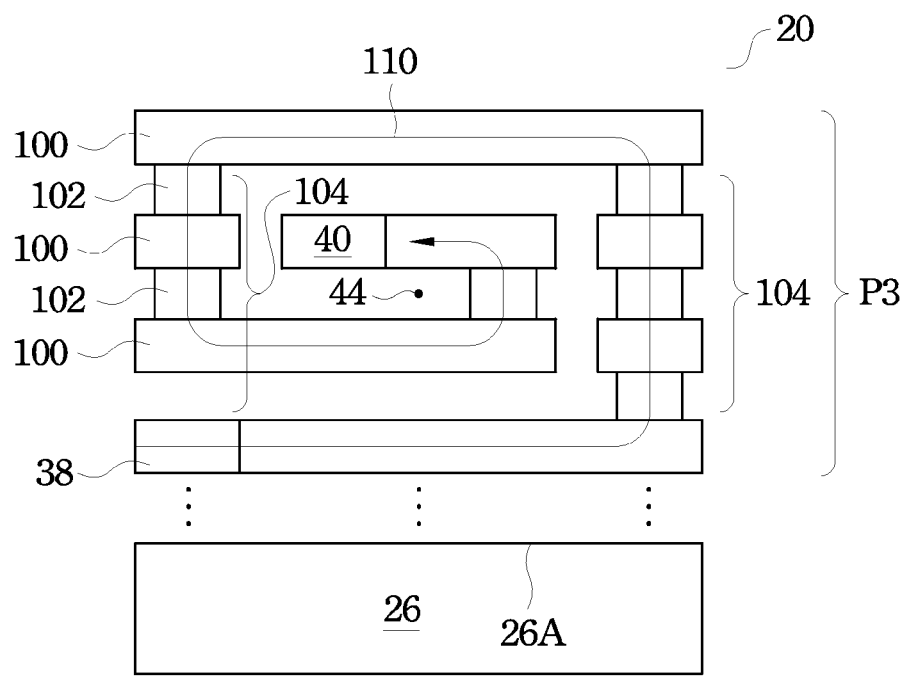

As shown FIGS. 3A and 3B, through metal line 36 (also refer to FIG. 2), part P1 of inductor 20 is connected to part P2. Similarly, starting from metal line 36, metal lines 100 and vias 102 form a spiral metal feature spinning from the inner side to the outer side (please refer to arrow 108), until metal line 38 is reached. Through metal line 38 (also refer to FIG. 2), part P2 of inductor 20 is connected to part P3, as shown in FIGS. 3B and 3C. In an embodiment, metal line 38 may act as the center tab, wherein an electrical connection can be made to center tab 38.

Figure 3D:
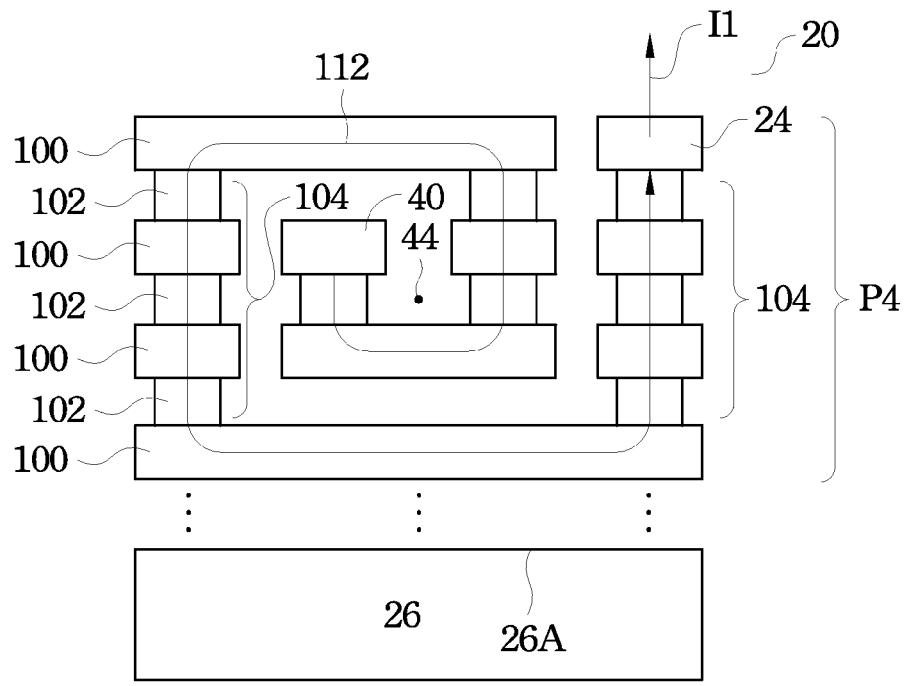

Referring to FIG. 3C, starting from metal line 38, metal lines 100 and vias 102 form a spiral metal feature spinning from the outer side to the inner side (please refer to arrow 110, assuming current I1 is injected), until metal line 40 is reached. Through metal line 40 (also refer to FIG. 2), part P3 of inductor 20 is connected to part P4, as shown in FIG. 3D. Again, in FIG. 3D, starting from metal line 40, metal lines 100 and vias 102 form a spiral metal feature spinning from the inner side to the outer side (please refer to arrow 112), until port 24 is reached.

In FIGS. 3A through 3D, the spiral metal features are formed of metal lines/pads 100 and vias 102. Each of the spiral metal features may comprise an outer metal feature having a rectangular shape, with a metal line 100 in a top layer of inductor 20 and a metal line 100 in a bottom layer of inductor 20 forming two sides of the rectangle, and columns 104 (FIG. 3A, for example), which are further formed of metal lines/pads 100 and vias 102, forming the other two sides of the rectangle. The rectangle has a break, so that it does not form a loop. Furthermore, to form the spiral shape, addition metal lines 100 and vias 102 are formed inside and connected to the rectangle.

Assuming current I1 (FIGS. 3A and 3D) is injected from port 22 and flows to port 24, current I1 flows in the counter-clockwise directions 106/108/110/112 in inductor parts P1 through P4. Conversely, if current I1 flows from port 24 to port 22, then current I1 flows in the counter-clockwise direction in each of parts P1 through P4. Each of parts P1 through P4 extends in a vertical plane that is perpendicular to major surface 26A of substrate 26, wherein the vertical planes are shown as planes Plane1 through Plane 4 in FIG. 2. Accordingly, inductor 20 is referred to as a vertical helical inductor. Furthermore, assuming axis 44 (also refer to FIGS. 1 through 3D) is an axis of the spiral metal features, then axis 44 extends in the direction parallel to the major surface 26A of substrate 26.

Figure 4:
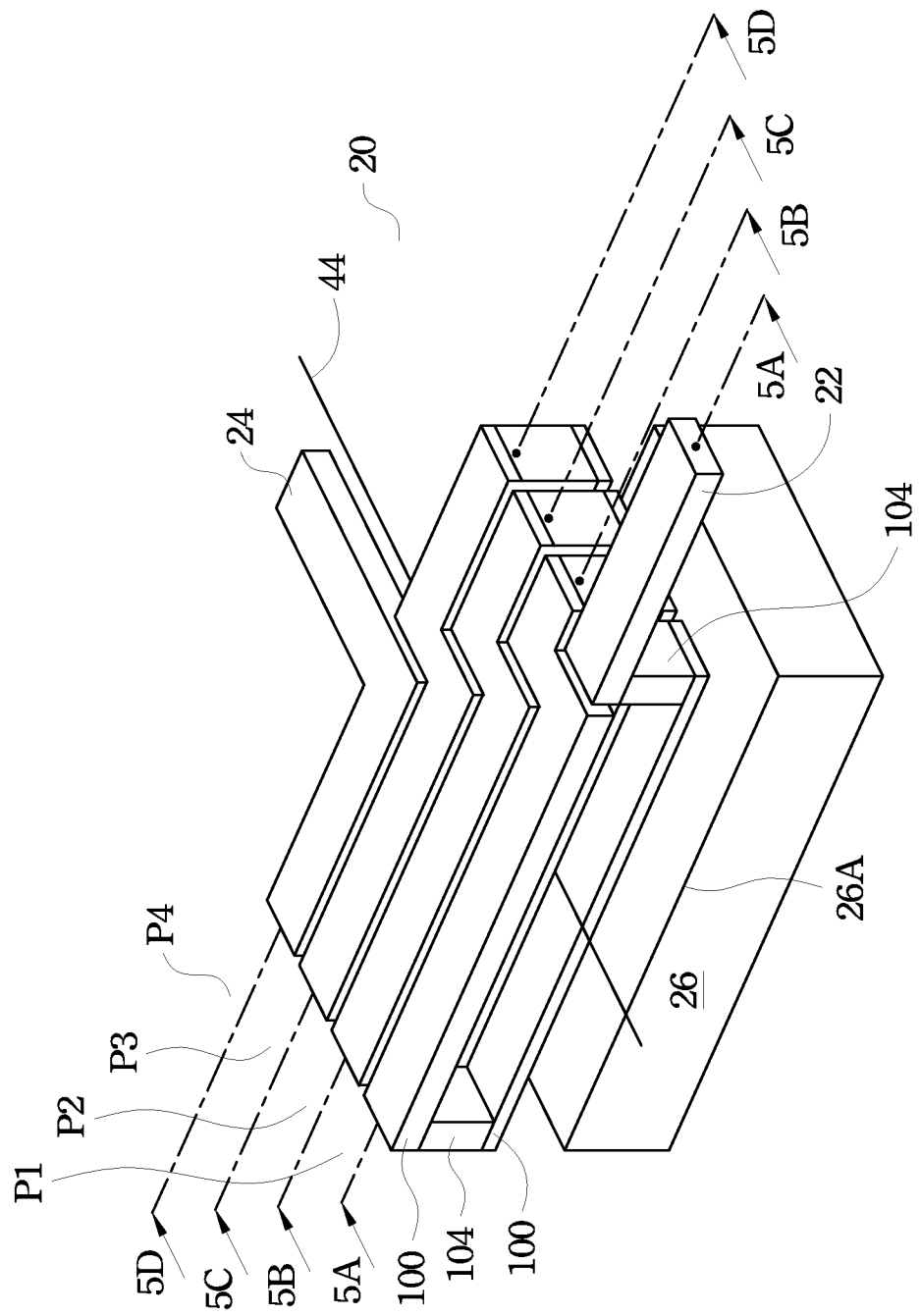
FIG. 4 illustrates a perspective view of a vertical inductor in accordance with an alternative embodiment.
Figure 5A:
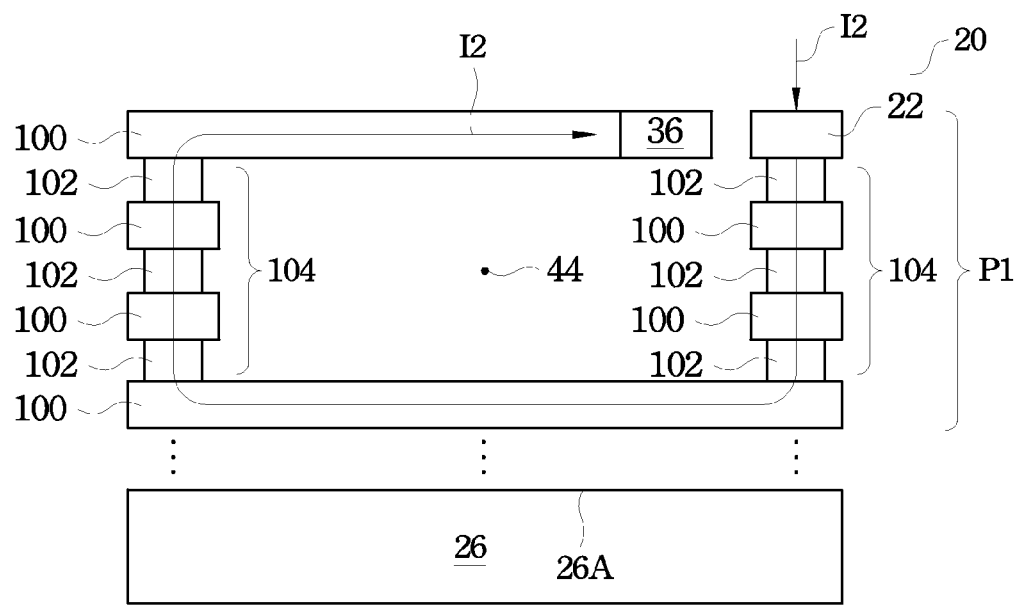
FIGS. 5A through 5D are cross-sectional views of the vertical inductor in FIG. 4.
Figure 5B:
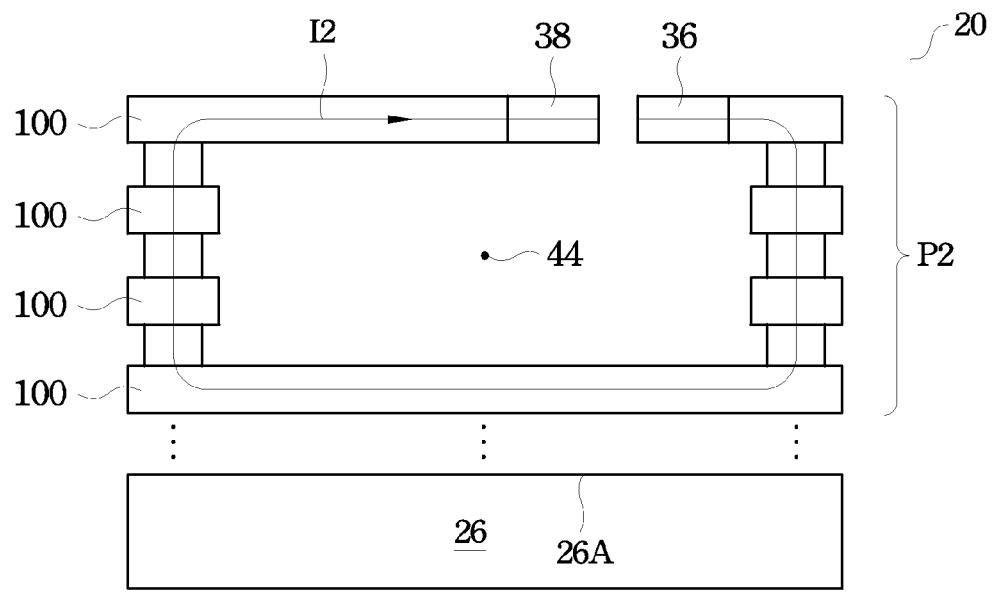
Figure 5C:
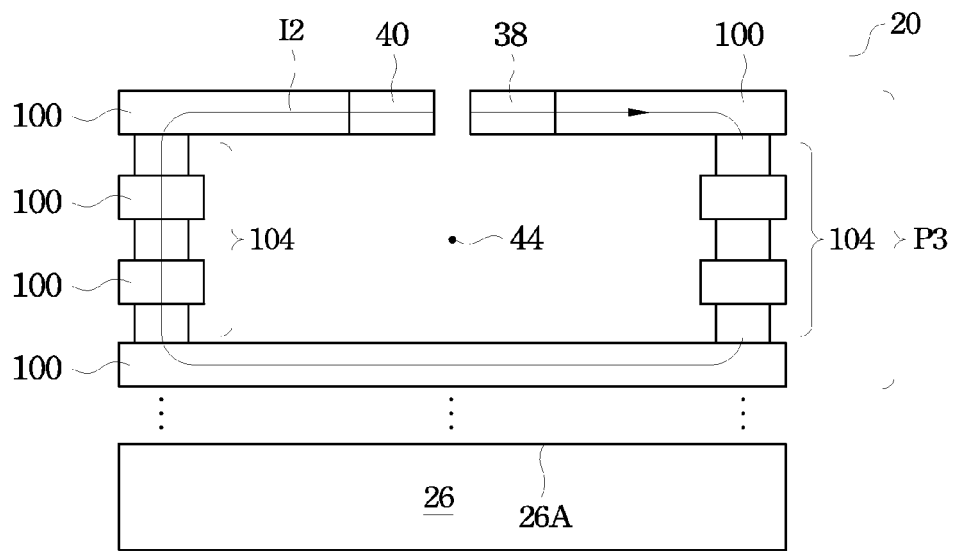
Figure 5D:
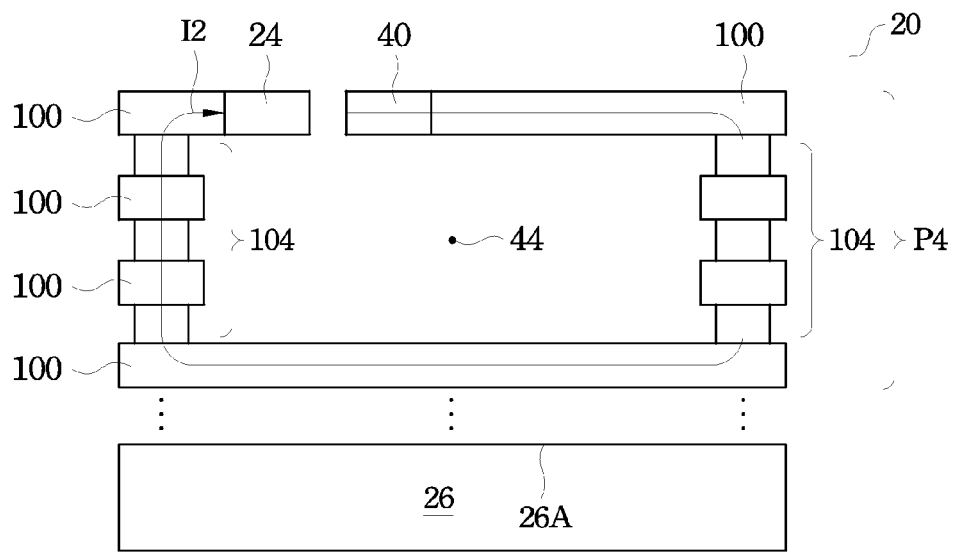

FIGS. 4 through 5D illustrate inductor 20 in accordance with an alternative embodiment. Unless specified otherwise, the reference numerals in these embodiments represent like elements in the embodiments illustrated in FIGS. 1 through 3D. This embodiment is similar to the embodiment as in FIGS. 1 through 3D, except that in each of inductor parts P1 through P4, instead of forming spiral metal features, metal connections form a single near-ring structure, which may have a rectangular shape, except there is a break in the near-ring structure. Each of inductor parts P1 through P4 extends in a vertical plane that is perpendicular to major surface 26A of substrate 26. Accordingly, inductor 20 as shown in FIGS. 4 through 5D is referred to as a vertical inductor. Parts P1 through P4 are interconnected to form a coil, wherein axis 44 of the coil extends in a direction parallel to major surface 26A of substrate 26.

FIGS. 5A through 5D are cross-sectional views of the structure shown in FIG. 4, wherein the cross-sectional views are obtained in the planes crossing lines 5A-5A, 5B-5B, 5C-5C, and 5D-5D, respectively, in FIG. 4. Referring to FIG. 5A, port 22 is electrically coupled to metal line 100 in a top metal layer of inductor 20. Metal column 104, which is also formed of metal lines/pads 100 and vias 102, connects port 22 to metal line 100 in a bottom layer of inductor 20. Through another metal column 104, the connection traverses back to metal line 100 that is in the same metal layer as port 22. Through metal line 36, part P1 of inductor 20 is connected to part P2, as shown in FIG. 5B.

Referring to FIG. 5B, in part P2, metal line 36 is electrically coupled to metal line 100 in the bottom layer of inductor 20, and the connection traverses to metal line 38 in the top layer of inductor 20. Through metal line 38, part P2 of inductor 20 is connected to part P3, as shown in FIG. 5C.

As shown in FIG. 5C, in part P3, metal line 38 is electrically coupled to metal line 100 in the bottom layer of inductor 20 through column 104, which is further coupled to metal line 40 through another metal column 104 and the metal line 100 in the top layer of inductor 20. Through metal line 40, part P3 of inductor 20 is connected to part P4, as shown in FIG. 5D, wherein metal line 40 is further electrically coupled to port 24 through metal lines 100 in the top layer and the bottom layer of inductor 20, and through metal columns 104. It is observed that if current I2 is injected into port 22, current I2 flows in a counter-clockwise direction in each of parts P1 through P4, until it flows to port 24. Conversely, if a current is injected into port 24, the current will flow in the clockwise direction in each of parts P1 through P4.

Comparing FIGS. 3A through 3D with FIGS. 5A through 5D, it is observed that all FIGS. 3A through 3D and FIGS. 5A through 5D may include the near-ring structures in the parts of the respective inductors. The near-ring structures are formed of the metal lines in the top layer and the bottom metal layer of inductor 20 and the metal columns therebetween. Furthermore, as shown in FIGS. 3A through 3D and 5A through 5D, each of inductor parts P1 through P4 may include a rectangular metal feature including two metal lines forming two sides of the rectangle, and metal columns 104 forming the other two sides of the rectangle.

Figure 6:
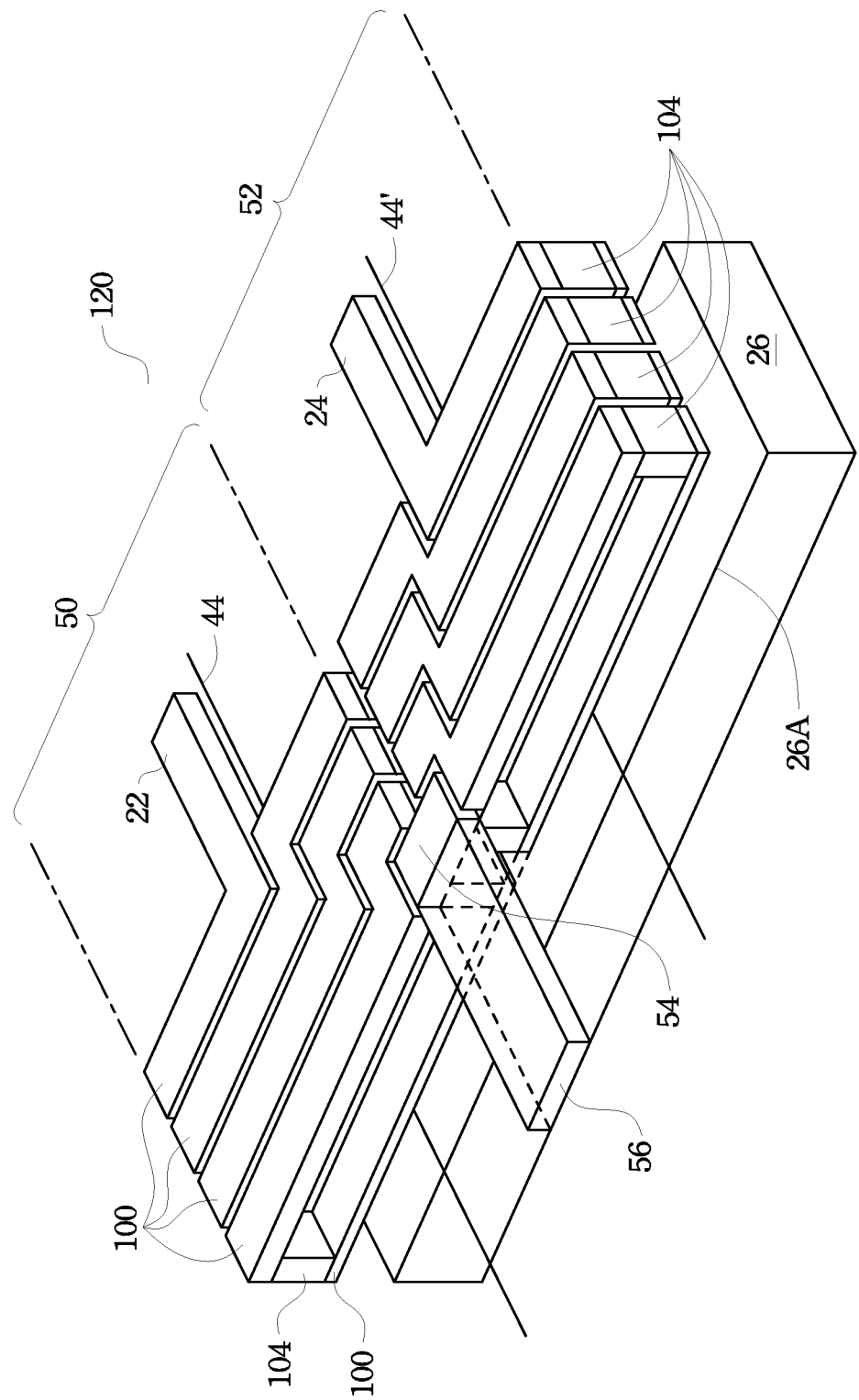
FIG. 6 illustrates a perspective view of a vertical inductor formed of two mirrored portions, wherein each of the portions has the structure shown in FIGS. 4 through 5D.

The inductor 20 as shown in FIG. 4 is an asymmetric inductor, in which ports 22 and 24 extends in different directions. FIG. 6 illustrates a perspective view of symmetric inductor 120, which includes inductors 50 and 52 interconnected to form inductor 120. The structure of inductor 50 may be essentially the same as the inductor 20 shown in FIG. 4. The structure of inductor 52 may, or may not, be mirrored from inductor 50. Inductor 52 may have axis 44, which is parallel to axis 44 of inductor 50, and parallel to major surface 26A of substrate 26. Metal line 54 interconnects inductor portions 50 and 52. In the embodiments a center tab is needed, metal line 54 may act as center tab, with metal line 56 connected to metal line 54.

By forming vertical inductors, the inductance density may be improved over that of conventional spiral inductors whose planes (in which the respective turns/semi-turns are located) are parallel to the major surfaces of the respective semiconductor substrates. Simulation results revealed that in a chip area of $50 \times 100$ $\mu m^2$, an inductor with an inductance of about 0.6 nH can be achieved if the embodiment shown in FIG. 1 is adopted. If the embodiments in FIGS. 4 and 6 are adopted, then the inductance values may be as high as about 0.45 nH (in a chip area of $50 \times 100$ $\mu m^2$) and about 0.9 nH (in a chip area of $100 \times 100$ $\mu m^2$), respectively. As a comparison, to achieve about 0.6 nH, a conventional spiral inductor needs about $50 \times 200$ $\mu m^2$. Therefore, the embodiments have improved inductance density. It is appreciated that the inductance density may have values slightly different from the above-presented results, depending on the routing, Simulation results also indicated that the Q value of the embodiment shown in FIG. 1 is about 7. Therefore, the structure shown in FIG. 1 has a high inductance value and a moderate Q value, and is suitable for high-frequency applications. If higher Q values are needed, the embodiments in FIGS. 4 and 6 may be adopted, wherein the respective Q values may reach about 16 to 17.

In accordance with embodiments, a device includes a substrate, and a vertical inductor over the substrate. The vertical inductor includes a plurality of parts formed of metal, wherein each of the parts extends in one of a plurality of planes perpendicular to a major surface of the substrate. Metal lines interconnect neighboring ones of the plurality of parts of the vertical inductor.

In accordance with other embodiments, a device includes a substrate; a plurality of metal layers over the substrate; and a vertical inductor. The vertical includes a plurality of parts formed of metal; and a spiral metal feature in each of the plurality of parts. The spiral metal feature comprises a plurality of metal lines in the plurality of metal layers and a plurality of vias interconnecting the plurality of metal lines. The spiral metal feature extends along a vertical plane perpendicular to a major surface of the substrate. Metal lines interconnect the plurality of parts.

In accordance with yet other embodiments, a device includes a substrate, and a vertical inductor over the substrate. The vertical inductor includes a coil formed of metal, with an axis of the coil extending in a direction parallel to a major surface of the substrate.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
a substrate; and
a vertical inductor over the substrate and comprising:
a plurality of parts formed of metal, wherein each of the parts has a spiral configuration that extends in one of a plurality of parallel planes perpendicular to a major surface of the substrate, each part of the plurality of parts having an input end and an output end, and wherein a first spiral of a first plurality of parts in a first plane spirals inward in one of a clockwise direction or a counter-clockwise direction, a second spiral of a second plurality of parts in a second plane spirals inward in an other one of the clockwise direction or the counter-clockwise direction, and a third spiral of a third plurality of parts in a third plane spirals inward in a same direction as the first plurality of parts, the first plane and the second plane being adjacent planes of the plurality of parallel planes, the second plane and the third plane being adjacent planes of the plurality of parallel planes, wherein an input to the first spiral in the first plane is at a different relative location than an input to the third spiral in the third plane such that an axis extending through the input to the first spiral and normal to the first plane does not extend through the input to the third spiral; and
at least one straight metal line parallel to the major surface of the substrate and interconnecting the output end of one of the plurality of parts to the input end of one of the plurality of parts in an adjacent parallel plane.

2. The device of claim 1, wherein each of the plurality of parts form a single spiral.

3. The device of claim 1, wherein each of the plurality of parts comprises:
a first metal line in a first metal layer;
a second metal line in a second metal layer over the first metal layer and vertically overlapping the first metal line; and
two metal columns interconnecting the first and the second metal lines and forming a near-ring structure with the first and the second metal lines, wherein the near-ring structure comprises a break therein.

4. The device of claim 1, wherein the input end of one of the plurality of parts comprises an input to the vertical inductor and the output end of another one of the plurality of parts comprises an output of the vertical inductor.

5. The device of claim 4, wherein the plurality of parts comprises:
a first part comprising a first spiral metal feature; and
a second part neighboring the first part and comprising a second spiral metal feature, wherein the first and the second parts are configured so that a same current flows from outer portions to inner portions of the first spiral metal feature, and from inner portions to outer portions of the second spiral metal feature.

6. The device of claim 1 wherein the metal lines interconnecting neighboring ones of the plurality of parts each have a longitudinal axis substantially parallel to the substrate, the longitudinal axes of neighboring metal lines being parallel and non-aligned.

7. The device of claim 1 wherein, neighboring ones of the plurality of parts have a same current flow direction.

8. A device comprising:
a substrate;
a plurality of metal layers over the substrate; and
a vertical inductor comprising:
a plurality of parts formed of metal;
a spiral metal feature in each of the plurality of parts, wherein the spiral metal feature comprises a plurality of metal lines in the plurality of metal layers and a plurality of vias interconnecting the plurality of metal lines, and wherein the spiral metal feature extends along a vertical plane perpendicular to a major surface of the substrate, neighboring ones of the spiral metal features having a same current flow direction, the plurality of parts comprising a first spiral metal feature in a first plane, a second spiral metal feature in a second plane, and a third spiral metal feature in a third plane, the first spiral metal feature and the second spiral feature being adjacent spiral metal features of the plurality of parts, the second spiral metal feature and the third spiral metal feature being adjacent spiral metal features of the plurality of parts;
metal lines interconnecting neighboring ones the plurality of parts;
a first port disposed in a first part of the plurality of parts; and
a second port disposed in a second part of the plurality of parts, the second part of the plurality of parts different from the first part of the plurality of parts;
wherein an input to the first spiral metal feature in the first plane is at a different relative location than an input to the third spiral metal feature in the third plane such that an axis extending through the input to the first spiral metal feature and normal to the first plane does not extend through the input to the third spiral metal feature; and
wherein the inductor is configured to route a current from the first port to the second port, and wherein the first port disposed at the same side of the vertical inductor as the second port, the first port and the second port extending from the inductor parallel to the vertical plane.

9. The device of claim 8, with an axis of the spiral metal features of the plurality of parts extends in a direction parallel to a major surface of the substrate.

10. The device of claim 8, wherein
a same current flows from outer portions to inner portions of the first spiral metal feature, and from inner portions to outer portions of the second spiral metal feature.

11. The device of claim 8, wherein the metal lines comprise:
a first metal line connecting the first spiral metal feature to the second spiral metal feature; and a second metal line connecting the second spiral metal feature to the third spiral metal feature, wherein the first and the second metal lines have lengthwise directions parallel to the major surface of the substrate.

12. The device of claim 8, wherein the vertical planes of the plurality of parts are parallel to each other.

13. The device of claim 8, wherein a first output end of the each part of the plurality of parts is disposed in a respective plane in a location different from the location of non-interconnected input ends and output ends of other parts of the plurality of parts.

14. A device comprising:
  an inductor disposed in a plurality of metal layers over a substrate and comprising:
    a plurality of spiral features, each of the plurality of spiral features comprising a plurality of metal features that extends in one of a plurality of parallel planes perpendicular to a major surface of the substrate, each of the plurality of spiral features having an input end in a first relative location in the spiral feature and an output end in a second relative location in the spiral feature, neighboring ones of the plurality of spiral features having a same current flow direction, neighboring ones of the plurality of spiral feature spiraling from an outer portion to an inner portion in opposite directions, the plurality of spiral features comprising a first spiral feature in a first plane, a second spiral feature in a second plane, and a third spiral feature in a third plane, the first spiral feature and the second spiral feature being adjacent spiral features of the plurality of spiral features, the second spiral feature and the third spiral feature being adjacent spiral features of the plurality of spiral features; and
    a plurality of connections each having a straight metal line interconnecting the output end of a respective first metal feature of the plurality of metal features to the input end of a neighboring second metal feature of the plurality of metal features;
  wherein an input to the first spiral feature is at a different relative location than an input to the third spiral feature such that an axis extending through the input to the first spiral feature and normal to the first plane does not extend through the input to the third spiral feature;
  wherein each of the straight metal lines is substantially parallel to a major surface of the substrate; and
  wherein the inductor has a first port disposed at the same side as a second port, the first port and the second port extending from the inductor parallel to the plurality of parallel planes.

15. The device of claim 14, wherein each of the plurality of metal features form a single spiral.

16. The device of claim 15, wherein the each of plurality of metal features are substantially parallel to each other.

17. The device of claim 16 wherein the metal lines of neighboring ones of the plurality of connections each have non-aligned longitudinal axes.

18. The device of claim 14, wherein each of the plurality of metal features comprises:
  a first metal line in a first metal layer of the plurality of metal layers;
  a second metal line in a second metal layer of the plurality of metal layers, the second metal layer and over the first metal layer and vertically overlapping the first metal line; and
  two metal columns interconnecting the first and the second metal lines and form a near-ring structure with the first and the second metal lines, wherein the near-ring structure comprises a break therein.

* * * * *